(12) United States Patent
Wang

(10) Patent No.: US 10,971,551 B2
(45) Date of Patent: Apr. 6, 2021

(54) ORGANIC LIGHT-EMITTING DIODE DISPLAY PANEL AND MANUFACTURING METHOD THEREFOR, AND DISPLAY APPARATUS

(71) Applicant: BOE TECHNOLOGY GROUP CO., LTD., Beijing (CN)

(72) Inventor: Huifeng Wang, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/328,834

(22) PCT Filed: Jan. 31, 2018

(86) PCT No.: PCT/CN2018/074828
§ 371 (c)(1),
(2) Date: Feb. 27, 2019

(87) PCT Pub. No.: WO2018/233297
PCT Pub. Date: Dec. 27, 2018

(65) Prior Publication Data
US 2019/0229152 A1    Jul. 25, 2019

(30) Foreign Application Priority Data
Jun. 21, 2017 (CN) .......................... 201710474903.7

(51) Int. Cl.
*H01L 27/32* (2006.01)
*H01L 51/56* (2006.01)
*H01L 51/52* (2006.01)

(52) U.S. Cl.
CPC .......... *H01L 27/32* (2013.01); *H01L 27/3246* (2013.01); *H01L 51/5206* (2013.01);
(Continued)

(58) Field of Classification Search
CPC ............. H01L 51/5228; H01L 27/3246; H01L 51/5234
See application file for complete search history.

(56) References Cited

U.S. PATENT DOCUMENTS 7,221,095 B2    5/2007  Yamazaki et al.
8,395,569 B2 *  3/2013  Min .................... H01L 27/3253
                                                  345/82
(Continued)

FOREIGN PATENT DOCUMENTS

CN    103296052 A    9/2013
CN    104124259 A    10/2014
(Continued)

OTHER PUBLICATIONS

Written Opinion of International Searching Authority, International App. No. PCT/CN2018/074828, WIPO, Apr. 2018, all pages. (Year: 2018).*

(Continued)

*Primary Examiner* — Victoria K. Hall
(74) *Attorney, Agent, or Firm* — Calfee, Halter & Griswold LLP

(57) ABSTRACT

An organic light-emitting diode display panel and a manufacturing method therefor, and a display apparatus are provided. The organic light-emitting diode display panel comprises: a base substrate; an anode and an auxiliary electrode arranged on the base substrate, wherein the anode and the auxiliary electrode are insulated from each other, a pixel definition layer arranged on the anode and the auxiliary electrode, wherein the pixel definition layer has a pixel opening region exposing the anode and a via exposing the auxiliary electrode; and the luminescent layer and a cathode (Continued)

sequentially arranged on the pixel definition layer, wherein the cathode is electrically connected to the auxiliary electrode arranged in the via.

8 Claims, 4 Drawing Sheets

(52) U.S. Cl.
CPC ...... *H01L 51/5228* (2013.01); *H01L 51/5234* (2013.01); *H01L 51/56* (2013.01)

(56) References Cited

U.S. PATENT DOCUMENTS

| | | | | |
|---|---|---|---|---|
| 8,928,011 B2* | 1/2015 | Tanada | H01L 27/3204 | 257/88 |
| 9,018,621 B2 | 4/2015 | Park et al. | | |
| 9,159,946 B2* | 10/2015 | Choi | H01L 51/5203 | |
| 9,362,345 B2* | 6/2016 | Jeong | H01L 27/3276 | |
| 9,502,480 B2* | 11/2016 | Kim | H01L 27/3246 | |
| 9,748,318 B2* | 8/2017 | Shim | H01L 27/3246 | |
| 9,859,345 B2* | 1/2018 | Lee | H01L 27/3246 | |
| 10,084,019 B2* | 9/2018 | Shim | H01L 51/0508 | |
| 10,108,290 B2* | 10/2018 | Hwang | G06F 3/0416 | |
| 10,177,205 B2* | 1/2019 | Kimura | H01L 27/3246 | |
| 10,566,396 B2* | 2/2020 | Lee | H01L 51/5221 | |
| 10,872,934 B2* | 12/2020 | Hayashi | G06F 3/0412 | |
| 10,886,360 B2* | 1/2021 | Li | H01L 27/3279 | |
| 2001/0054867 A1* | 12/2001 | Kubota | H01L 27/3246 | 313/504 |
| 2003/0006697 A1* | 1/2003 | Weaver | H01L 27/3246 | 313/503 |
| 2004/0160170 A1* | 8/2004 | Sato | H01L 27/3276 | 313/504 |
| 2005/0012454 A1* | 1/2005 | Yamazaki | H01L 27/3279 | 313/506 |
| 2005/0077816 A1* | 4/2005 | Yamada | H01L 51/5228 | 313/503 |
| 2005/0214577 A1* | 9/2005 | Sakamoto | H01L 27/3283 | 428/690 |
| 2006/0119259 A1* | 6/2006 | Bae | H01L 27/3246 | 313/506 |
| 2007/0064486 A1* | 3/2007 | Sung | H01L 27/3246 | 365/185.13 |
| 2007/0194307 A1* | 8/2007 | Kim | H01L 27/3246 | 257/40 |
| 2007/0222380 A1* | 9/2007 | Yamazaki | G09G 3/3233 | 313/509 |
| 2008/0001535 A1* | 1/2008 | Kim | H01L 27/3246 | 313/505 |
| 2009/0009069 A1* | 1/2009 | Takata | H01L 27/3246 | 313/504 |
| 2009/0015153 A1* | 1/2009 | Asano | H01L 51/5237 | 313/504 |
| 2010/0051929 A1* | 3/2010 | Choi | H01L 51/5284 | 257/40 |
| 2011/0316007 A1* | 12/2011 | Sagawa | H01L 27/3246 | 257/88 |
| 2012/0043565 A1* | 2/2012 | Sagawa | H01L 27/3211 | 257/89 |
| 2012/0205678 A1* | 8/2012 | Ikeda | H01L 27/3276 | 257/88 |
| 2012/0206036 A1* | 8/2012 | Tanaka | H01L 27/3204 | 313/504 |
| 2012/0223342 A1* | 9/2012 | Tanada | H01L 27/3204 | 257/88 |
| 2012/0228603 A1* | 9/2012 | Nakamura | H01L 51/5253 | 257/40 |
| 2013/0056784 A1* | 3/2013 | Lee | H01L 27/3279 | 257/99 |
| 2013/0069067 A1* | 3/2013 | Youn | H01L 27/3246 | 257/59 |
| 2013/0099218 A1* | 4/2013 | Lee | H01L 51/5203 | 257/40 |
| 2013/0248867 A1* | 9/2013 | Kim | H01L 27/3246 | 257/59 |
| 2013/0299791 A1* | 11/2013 | Hirakata | H01L 27/3246 | 257/40 |
| 2014/0183479 A1* | 7/2014 | Park | H01L 51/56 | 257/40 |
| 2014/0183501 A1* | 7/2014 | Kim | H01L 27/3246 | 257/40 |
| 2014/0312323 A1* | 10/2014 | Park | H01L 51/525 | 257/40 |
| 2014/0312329 A1* | 10/2014 | Fujii | H01L 51/5228 | 257/40 |
| 2014/0332763 A1* | 11/2014 | Kim | H01L 51/5268 | 257/40 |
| 2015/0001507 A1* | 1/2015 | Kim | H01L 27/3246 | 257/40 |
| 2015/0008398 A1* | 1/2015 | Lee | H01L 51/5228 | 257/40 |
| 2015/0014658 A1* | 1/2015 | Choung | H01L 51/5228 | 257/40 |
| 2015/0090989 A1* | 4/2015 | Matsumoto | H01L 27/3246 | 257/40 |
| 2015/0097171 A1* | 4/2015 | Kim | H01L 27/3246 | 257/40 |
| 2015/0144902 A1* | 5/2015 | Do | H01L 27/3246 | 257/40 |
| 2015/0144906 A1* | 5/2015 | Ichikawa | H01L 51/5228 | 257/40 |
| 2015/0179719 A1* | 6/2015 | Nam | H01L 27/3246 | 257/40 |
| 2015/0188077 A1* | 7/2015 | Kim | H01L 51/5203 | 257/40 |
| 2016/0013438 A1* | 1/2016 | Im | H01L 51/5228 | 257/40 |
| 2016/0043341 A1* | 2/2016 | Heo | H01L 27/3246 | 257/40 |
| 2016/0149156 A1* | 5/2016 | Kim | H01L 51/0097 | 257/40 |
| 2016/0254475 A1* | 9/2016 | Tsukamoto | H01L 51/5012 | 257/40 |
| 2016/0293888 A1* | 10/2016 | Shim | H01L 27/3246 | |
| 2016/0351651 A1* | 12/2016 | Jang | H01L 51/5218 | |
| 2016/0351851 A1* | 12/2016 | Lee | H01L 27/3248 | |
| 2017/0033166 A1* | 2/2017 | Shim | H01L 27/3279 | |
| 2017/0047386 A1* | 2/2017 | Lee | H01L 27/3246 | |
| 2017/0062548 A1* | 3/2017 | Han | H01L 51/5209 | |
| 2017/0062755 A1* | 3/2017 | Im | H01L 51/5228 | |
| 2017/0069695 A1* | 3/2017 | Choung | H01L 51/5228 | |
| 2017/0125495 A1* | 5/2017 | Lee | H01L 27/3246 | |
| 2017/0125507 A1* | 5/2017 | Lee | H01L 27/3213 | |
| 2017/0141176 A1* | 5/2017 | Im | H01L 51/5228 | |
| 2017/0170243 A1* | 6/2017 | An | H01L 27/326 | |
| 2017/0179208 A1* | 6/2017 | Jang | H01L 27/3246 | |
| 2017/0186831 A1* | 6/2017 | Nam | H01L 27/3276 | |
| 2017/0194415 A1* | 7/2017 | Choi | H01L 51/5234 | |
| 2017/0237040 A1* | 8/2017 | Kobori | H01L 27/3246 | 257/40 |
| 2017/0317154 A1* | 11/2017 | Heo | H01L 27/3211 | |
| 2017/0346023 A1* | 11/2017 | Jankus | H01L 51/5068 | |
| 2017/0346037 A1* | 11/2017 | Huang | H01L 51/5278 | |
| 2018/0006106 A1* | 1/2018 | Oh | H01L 27/322 | |
| 2018/0006264 A1* | 1/2018 | Lee | H01L 51/5212 | |
| 2018/0033968 A1* | 2/2018 | Lee | H01L 27/3246 | |
| 2018/0061904 A1* | 3/2018 | Shim | H01L 51/102 | |
| 2018/0062109 A1* | 3/2018 | Kim | H01L 27/3246 | |
| 2018/0097047 A1* | 4/2018 | Jung | H01L 27/3258 | |
| 2018/0120620 A1* | 5/2018 | Shim | H01L 27/3279 | |
| 2018/0122876 A1* | 5/2018 | Shim | H01L 27/3276 | |
| 2018/0123078 A1* | 5/2018 | Byun | H01L 51/5206 | |
| 2018/0138251 A1* | 5/2018 | Kang | H01L 27/3276 | |
| 2018/0159060 A1* | 6/2018 | Verilhac | H01L 31/022466 | |
| 2018/0233694 A1* | 8/2018 | Ajiki | H01L 27/3246 | |

(56) References Cited

U.S. PATENT DOCUMENTS

2019/0157352 A1\* 5/2019 Li .......................... H01L 27/322
2020/0203469 A1\* 6/2020 Li ........................ H01L 27/3279

FOREIGN PATENT DOCUMENTS

| CN | 103296052 B | | 11/2015 | | |
|---|---|---|---|---|---|
| CN | 106856203 A | \* | 6/2017 | ......... | H01L 27/3246 |
| CN | 106856203 A | | 6/2017 | | |
| EP | 3343663 A1 | \* | 7/2018 | ......... | H01L 27/3246 |

OTHER PUBLICATIONS

Machine translation, Chen, Chinese Pat. Pub. No. CN 106856203A, translation date: Nov. 2, 2020, Espacenet, all pages. (Year: 2020).\*
Search Report and Written Opinion for International Application No. PCT/CN2018/074828 dated Apr. 24, 2018.
First Office Action for Chinese Patent Application No. 201710474903.7 dated Mar. 4, 2020.

\* cited by examiner

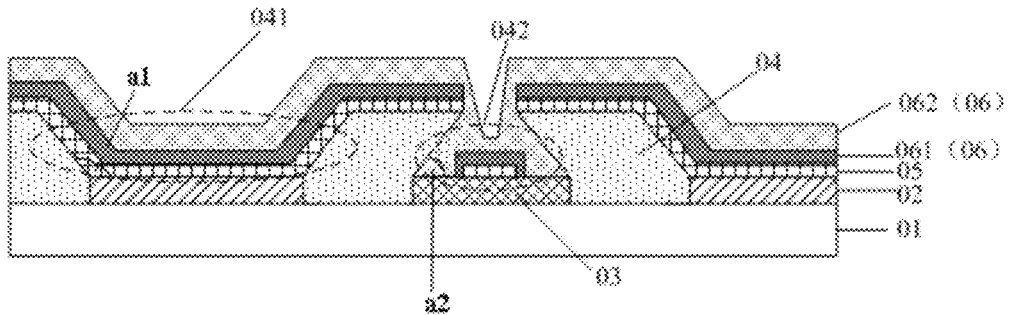

Fig. 1

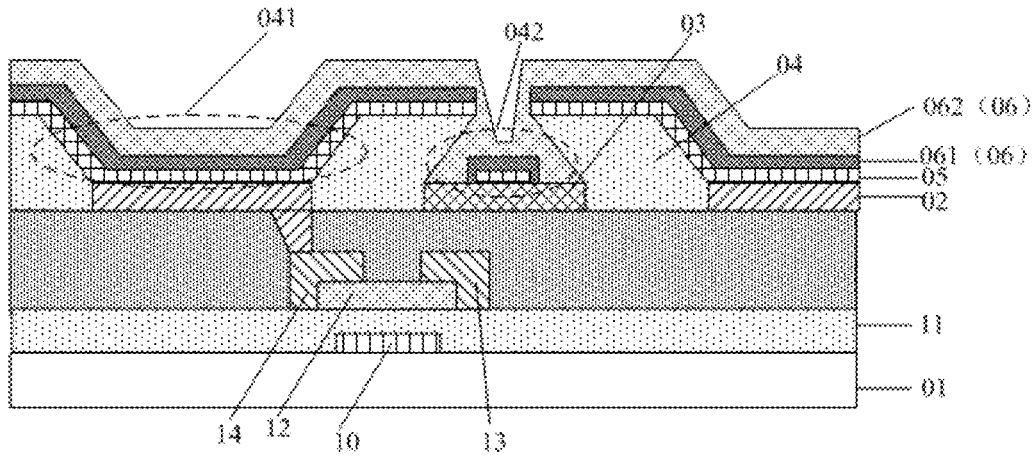

Fig. 2

- S301: Patterns of an anode and an auxiliary electrode are formed on a base substrate, where the anode and the auxiliary electrode are insulated from each other

- S302: Patterns of a pixel definition layer are formed on the anode and the auxiliary electrode by a single step-patterning process, where the pixel definition layer includes a pixel opening region exposing the anode and a via exposing the auxiliary electrode, the pixel opening region makes an obtuse angle between an edge of the pixel definition layer and anode, and the via makes an acute angle between the edge of the pixel definition layer and the auxiliary electrode

- S303: Patterns of a luminescent layer and a cathode are sequentially formed on the pixel definition layer, where the cathode is electrically connected to an auxiliary electrode arranged in a second via

Fig. 3

ORGANIC LIGHT-EMITTING DIODE DISPLAY PANEL AND MANUFACTURING METHOD THEREFOR, AND DISPLAY APPARATUS

CROSS REFERENCE

The present application is based on International Application No. PCT/CN2018/074828, filed on Jan. 31, 2018, which claims priority to Chinese Patent Application No. 201710474903.7, filed on Jun. 21, 2017, and the entire contents thereof are incorporated herein by reference.

TECHNICAL FIELD

The present disclosure relates to the field of display technologies, and in particular, to an organic light-emitting diode display panel and a manufacturing method therefor, and a display apparatus.

BACKGROUND

Among different types of flat display panels, organic light-emitting diode (OLED) display panels have been widely recognized due to their advantages of self-luminescence, fast response, wide viewing angle, high brightness, bright colors, and thin thickness and light weight.

Generally, for a top emission type OLED light-emitting device, in order to increase light transmittance ratio thereof, a cathode needs to be made with a thin transparent conductive material. However, the thinner the transparent cathode is, the larger square resistance it will have, and the larger voltage drop will occur when current flows through the cathode. Therefore, the farther pixels are located from the power supply point, the smaller cathode voltages will be applied on the pixels, which results in that the display brightness of such pixels are lower than the display brightness of the pixels closer to the power supply point, and thereby a brightness uniformity of the OLED display is deteriorated.

SUMMARY

The present disclosure provides an organic light-emitting diode display panel and a manufacturing method therefor, and a display apparatus.

According to an aspect of the present disclosure, an organic light-emitting diode display panel is provided, the display panel comprising: a base substrate; an anode and an auxiliary electrode arranged on the base substrate, wherein the anode and the auxiliary electrode are insulated from each other; a pixel definition layer arranged on the anode and the auxiliary electrode, wherein the pixel definition layer includes a pixel opening region exposing the anode and a via exposing the auxiliary electrode, the pixel opening region makes an obtuse angle between an edge of the pixel definition layer and the anode, and the via makes an acute angle between the edge of the pixel definition layer and the auxiliary electrode; a luminescent layer and a cathode sequentially arranged on the pixel definition layer, wherein the cathode is electrically connected to the auxiliary electrode arranged in the via.

In a possible implementation embodiment, in the aforesaid organic light emitting diode display panel provided by embodiments of the present disclosure, the cathode comprises a cathode metal layer in contact with the luminescent layer and a cathode transparent conductive layer arranged on the cathode metal layer; wherein the cathode metal layer arranged in the via is discontinuous from the cathode metal layer arranged on both sides of the via, and the cathode transparent conductive layer arranged in the via is continuous with the cathode transparent conductive layer arranged on both sides of the via, and the cathode transparent conductive layer is filled to the acute angle of the via such that the cathode transparent conductive layer is in contact with the auxiliary electrode in the via.

In a possible implementation embodiment, in the aforesaid organic light emitting diode display panel provided by embodiments of the present disclosure, thickness of the cathode transparent conductive layer is greater than thickness of the cathode metal layer.

In a possible implementation embodiment, in the aforesaid organic light emitting diode display panel provided by embodiments of the present disclosure, the cathode metal layer has a thickness of 1 to 30 nm.

In a possible implementation embodiment, in the aforesaid organic light emitting diode display panel provided by embodiments of the present disclosure, the cathode transparent conductive layer has a thickness of 10 to 1000 nm.

In a possible implementation embodiment, in the aforesaid organic light emitting diode display panel provided by embodiments of the present disclosure, the auxiliary electrode and the anode have the same material and are arranged in the same layer.

According to the second aspect of the present disclosure, an organic light-emitting diode display apparatus is provided, comprising the organic light-emitting diode display panel described above provided by embodiments of the present disclosure.

According to the third aspect of the present disclosure, a manufacturing method of an organic light-emitting diode display panel is provided, the method comprising: forming patterns of an anode and an auxiliary electrode on a base substrate, wherein the anode and the auxiliary electrode are insulated from each other; forming a pattern of a pixel definition layer on the anode and the auxiliary electrode, wherein the pixel definition layer includes a pixel opening region exposing the anode and a via exposing the auxiliary electrode, the pixel opening region makes an obtuse angle between an edge of the pixel definition layer and anode, and the via makes an acute angle between the edge of the pixel definition layer and the auxiliary electrode; forming a pattern of a luminescent layer and a cathode sequentially on the pixel definition layer, wherein the cathode is electrically connected to the auxiliary electrode arranged in the via.

In a possible implementation embodiment, in the aforesaid manufacturing method of the organic light emitting diode display panel provided by embodiments of the present disclosure, forming a pattern of a pixel definition layer on the anode and the auxiliary electrode is formed by single-step patterning process, and comprises: forming the pixel definition layer on the pattern of the anode and the auxiliary electrode; performing an exposure process on the pixel defining layer by light with a first oblique angle and light with a second oblique angle, respectively, so that the pixel defining layer forms a pattern of the pixel opening region exposing the anode and the via exposing the auxiliary electrode, wherein the pixel opening region makes the obtuse angle between the edge of the pixel definition layer and anode, and the via makes the acute angle between the edge of the pixel definition layer and the auxiliary electrode.

In a possible implementation embodiment, in the aforesaid manufacturing method of the organic light emitting diode display panel provided by embodiments of the present disclosure, forming the pattern of the luminescent layer and a cathode sequentially on the pixel definition layer comprises: forming a pattern of the luminescent layer on the pixel definition layer; forming a pattern of the cathode metal layer on the pattern of the luminescent, wherein the cathode metal layer in the via is discontinuous from the cathode metal layer on both sides of the via; forming a pattern of a cathode transparent conductive layer on the cathode metal layer, wherein the cathode comprises a cathode metal layer and a cathode transparent conductive layer, and the cathode transparent conductive layer arranged in the via is continuous with the cathode transparent conductive layer arranged on both sides of the via, and the cathode transparent conductive layer is filled to the acute angle of the via such that the cathode transparent conductive layer is in contact with the auxiliary electrode in the via.

In a possible implementation embodiment, in the aforesaid manufacturing method of the organic light emitting diode display panel provided by embodiments of the present disclosure, forming the pattern of the cathode metal layer on the pattern of the luminescent, comprising: forming a pattern of the cathode metal layer on the pattern of the luminescent by an evaporation method.

In a possible implementation embodiment, in the aforesaid manufacturing method of the organic light emitting diode display panel provided by embodiments of the present disclosure, forming a pattern of a cathode transparent conductive layer on the cathode metal layer, comprising: forming a pattern of a cathode transparent conductive layer on the cathode metal layer, by a sputtering method.

BRIEF DESCRIPTION OF THE DRAWINGS

FIG. 1 is a schematic structural diagram of an organic light emitting diode display panel provided by embodiments of the present disclosure;

FIG. 2 is schematic structural diagrams of an organic light emitting diode display apparatus provided by embodiments of the present disclosure;

FIG. 3 is schematic flow charts of a manufacturing method of an organic light emitting diode display panel provided by embodiments of the present disclosure;

DETAILED DESCRIPTION

Figure 4A:
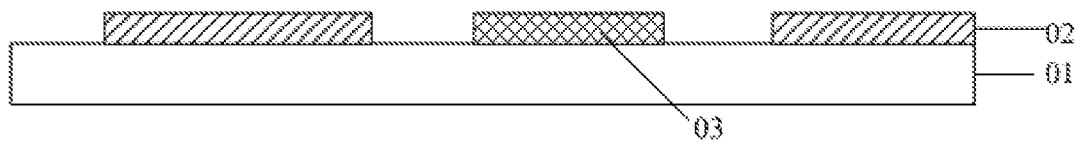
FIG. 4A to FIG. 4D are schematic structural diagrams of a manufacturing method of a pixel definition layer after performing each step provided by embodiments of the present disclosure.

In order to make the above described objects, features and advantages of the present disclosure more apparent and understandable, the present disclosure will be further explained combined with drawings and examples. However, example embodiments may be embodied in a variety of forms and should not be construed as being limited to the embodiments set forth herein; rather, these embodiments are provided to make the present disclosure more comprehensive and complete, and fully convey the concept of the example embodiments to those skilled in the art. The same reference numerals in the drawings denote the same or similar structures, and a repetitive description thereof will be omitted. The words expressing the position and the orientation described in the present disclosure are explained by taking the drawings as an example. However, changes may be made as needed, and the changes are included in the protection scope of the present disclosure. The drawings of the present disclosure are only for illustrating relative positional relationships. The layer thickness of some parts is drawn in an exaggerated way for easy understanding. The layer thickness in the drawings does not represent the proportional relationship of actual layer thickness.

It should to be noted that the specific details are set forth in the following description to facilitate a full understanding of the present disclosure. The present disclosure can be implemented in a variety of other ways than those described herein. Similar modifications and variations can be made by those skilled in the art without departing from the principles of the present disclosure. Therefore, the present disclosure is not limited by the specific embodiments disclosed below. Some terms are used throughout the description and claims to refer to particular components, and those skilled in the art will understand that the hardware manufacturer may refer to the same component by different nouns. The present specification and the claims do not use the difference in the name as the means for distinguishing the components, rather the difference in functionality of the components is used as a criterion for distinguishing. As used in the specification and the claims, "includes/includes" is an open term and should be interpreted as "including but not limited to". The following description of the specification is a better way to implement the application, but the description is for the purpose of explaining the general principles of the application and does not intend to limit the protection scope of the application. The protection scope of the application is subject to the definition of the appended claims. It should be understood that when an element such as a layer, a film, a region or a substrate is referred to as being "on" another element, it may be directly located on the another element, or one or more intermediate elements may be inserted.

The present disclosure provides an organic light-emitting diode display panel and a manufacturing method therefor, and a display apparatus, which avoids the problem that the brightness uniformity of the OLED display panel is poor due to a large cathode resistance.

Hereinafter, an exemplary embodiment of an organic light-emitting diode display panel and a manufacturing method therefor, and a display apparatus provided by embodiments of the present disclosure will be described in detail with reference to the accompanying drawings.

The thickness and shape of various film layers in the drawings do not reflect the true proportions, and are merely intended to illustrate the present disclosure.

Referring to FIG. 1, an organic light-emitting diode display panel provided by embodiments of the present disclosure comprises: a base substrate 01; an anode 02 and an auxiliary electrode 03 arranged on the base substrate 01, a pixel definition layer 04 arranged on the anode 02 and the auxiliary electrode 03, a luminescent layer 05 and a cathode sequentially 06 arranged on the pixel definition layer 04. wherein, the anode 02 and the auxiliary electrode 03 are insulated from each other, and the pixel definition layer 04 has a pixel opening region 041 exposing the anode and a via 042 exposing the auxiliary electrode 03. The pixel opening region 041 makes an obtuse angle between an edge (90°-180°) of the pixel definition layer and the anode, as shown in angle a1 in FIG. 1. The via 042 makes an acute angle (0°-90°) between the edge of the pixel definition layer and the auxiliary electrode, as shown in angle a2 in FIG. 1. The cathode 06 is electrically connected to the auxiliary electrode 03 arranged in the via.

It should be noted that, when the luminescent layer is formed on the pixel defining layer, since the via makes an acute angle between the edge of the pixel defining layer and the auxiliary electrode, the luminescent layer in the via and the luminescent layer on both sides of the via are discontinuous, that is, a disconnection occurs. Since the luminescent layer is not present at the acute angle of the via, when the cathode is formed on the luminescent layer, the cathode is filled to the acute angle in the via, so that the cathode is in direct contact with the auxiliary electrode, thereby electrically connecting the auxiliary electrode. Wherein, in the via in embodiments of the present disclosure, due to the existence of the acute angle, exhibits a shape with wide bottom and narrow top. However, the pixel opening region, in which there is no acute angle exhibits a shape with narrow bottom and wide top. It should be understood that the via and the pixel opening region of the present disclosure may take a variety of shapes and are not limited to shapes illustrated in the figures and in the embodiments as examples. Since the pixel opening region makes the obtuse angle between the edged of the pixel defining layer and the anode, the luminescent layer and the cathode are formed continuously at the pixel opening region, and the luminescent layer between the anode and the cathode is a pixel region. Since the via makes the acute angle between the edge of the pixel defining layer and the auxiliary electrode, when the luminescent layer is formed in the via, a fault occurs, that is, the luminescent layer in the via and the luminescent layer on both sides of the via are broken. The existence of the acute angle in the via prevents the luminescent layer from filling into the acute angle. Therefore, when the cathode on the luminescent layer is formed, the cathode is in direct contact with the auxiliary electrode. The auxiliary electrode is electrically connected, thereby avoiding the problem that the luminescent layer between the auxiliary electrode and the cathode emits light due to the existence of the auxiliary electrode.

In the organic emitting-light diode display panel provided by embodiments of the present disclosure, by adding the auxiliary electrode in the display panel, and forming the via exposing the auxiliary electrode when pixel defining layer is formed, the via makes the acute angle between the edge of the pixel defining layer and the auxiliary electrode, so that a fault occurs when the luminescent layer is formed on the pixel defining layer. That is, the luminescent layer in the via and the luminescent layer on both sides of the via are broken. The existence of the acute angle in the via prevents the luminescent layer from filling into the acute angle. Therefore, when the cathode on the luminescent layer is formed, the auxiliary electrode and the cathode are electrically connected by the via. Therefore, in embodiments of the present disclosure, by adding the auxiliary electrode, the auxiliary electrode and the cathode are electrically connected, thereby reducing the resistance of the cathode. The problem of poor brightness uniformity of the OLED display panel is avoided.

In the aforesaid organic emitting-light diode display panel provided by embodiments of the present disclosure, referring to FIG. 1, the cathode 06 may comprise a cathode metal layer 061 in contact with the luminescent layer 05 and a cathode transparent conductive layer 062 arranged on the cathode metal layer 061; wherein the cathode metal layer 061 arranged in the via 042 is discontinuous from the cathode metal layer 061 arranged on both sides of the via 042, and the cathode transparent conductive layer 062 arranged in the via 042 is continuous with the cathode transparent conductive layer 062 arranged on both sides of the via 042, and the cathode transparent conductive layer 062 is filled to the acute angle of the via 042 such that the cathode transparent conductive layer 062 and the auxiliary electrode 03 in the via are in contact and electrically connected.

OLED light-emitting device may comprise the anode, the luminescent layer, and the cathode. Wherein, the anode may be a transparent electrode and may be formed of, for example, indium tin oxide (ITO), indium zinc oxide (IZO), zinc oxide (ZnO), or indium oxide (in2O3), etc. the cathode may further be reflective electrode and a transparent electrode arranged on the reflective electrode, and the reflective electrode may be formed of Ag, magnesium (Mg), Al, Pt, Pd, Au, Ni, Nd, iridium (Ir), Cr, or a mixture thereof. The transparent electrode may be formed of a material such as ITO, IZO, ZnO, In2O3, etc. luminescent layer may be formed of a low molecular weight organic material or a high molecular weight organic material. The luminescent layer comprises an organic emission layer, and may further comprise at least one of a hole injection layer (HIL), a hole transport layer (HTL), an electron transport layer (ETL), and an electron injection layer (EIL). However, in addition to the organic emission layer, the luminescent layer may comprise other various functional layers. The cathode comprises a cathode metal layer and a cathode transparent conductive layer, wherein the cathode metal layer may be formed of aluminum (Al), magnesium (Mg), silver (Ag), etc. and a compound thereof. The cathode transparent conductive layer may be formed of a transparent electrode material such as ITO, IZO, ZnO, or In2O3, etc. The pixel defining layer may be formed of an organic material such as polyimide (PI), polyamide, benzocyclobutene (BCB), acryl resin, or phenol resin, etc.

Wherein, for top emission type OLED device, the cathode metal layer may be manufactured thinner, so that the light is well transmitted or reflected. Therefore, when the cathode metal layer is formed at an acute angle of the via, there is a fault, that is, the cathode metal layer and the cathode metal layer on both sides of the via are discontinuous. In addition, the thickness of the cathode transparent conductive layer may be manufactured larger than the thickness of the cathode metal layer. Therefore, when the cathode transparent conductive layer is formed, the acute angle in the via may be formed, so that the cathode transparent conductive layer is in direct contact with the auxiliary electrode, and the cathode transparent conductive layer in the via is continuous with the cathode transparent conductive layer on both sides of the via.

In the aforesaid organic emitting-light diode display panel provided by embodiments of the present disclosure, the thickness of the cathode transparent conductive layer may be greater than the thickness of the cathode metal layer. For example, the thickness of the cathode metal may be any value between 1 nm-30 nm, and the thickness of the cathode transparent conductive layer may be any value between 10 nm-1000 nm. There is no limit here.

In the aforesaid organic emitting-light diode display panel provided by embodiments of the present disclosure, the material of the auxiliary electrode is the same as the material of the anode, and the auxiliary electrode and the anode may be arranged in the same layer. For example, when the anode is a reflective electrode and is only one layer structure, the material of the auxiliary electrode is the same as the material of the anode, and the auxiliary electrode and the anode are only arranged with one layer structure. When the anode is formed by two film layers of the reflective electrode and the transparent electrode, the auxiliary electrode may further use the same material as the material of the anode and including forming of the two film layers of the reflective electrode and the transparent electrode. The auxiliary electrode and the anode electrode are arranged in the same layer.

In the aforesaid organic emitting-light diode display panel provided by embodiments of the present disclosure, by adding the auxiliary electrode in the display panel and forming the via exposing the auxiliary electrode when the pixel defining layer is formed, the via makes the acute angle between the pixel defining layer and the auxiliary electrode. Thereby, when the luminescent layer and the cathode layer are formed on the pixel defining layer, the auxiliary electrode and the cathode are electrically connected by the via. Therefore, in embodiments of the present disclosure, by adding the auxiliary electrode and electrically connecting the auxiliary electrode and the cathode, the resistance of the cathode is reduced, thereby avoiding the problem that the brightness uniformity of the OLED display panel is poor.

Based on same inventive concept, referring to FIG. 2, an organic light emitting diode display apparatus provided by embodiments of the present disclosure may comprise any organic light-emitting diode display panels as provided hereinbefore by embodiments of the present disclosure.

Referring to FIG. 2, the display apparatus provided by embodiments of the present disclosure further comprises: a thin film transistor electrically connected to the anode. The thin film transistor sequentially comprises a gate 10 arranged on the base substrate 01, a gate insulating layer 11, a semiconductor active layer 12 arranged on the gate insulating layer 11, wherein the semiconductor active layer comprises a source region and a drain region formed by doping N-type impurity ions or P-type impurity ions, and a channel region not doped with impurities and located at a region between the source region and the drain region. A pattern of the source 13 and the drain 14 is formed on the semiconductor active layer 12. The source 13 and the drain 14 are electrically connected to the source region and the drain region in the semiconductor active layer, respectively. Wherein, the anode 02 of the OLED light-emitting device is electrically connected to the source 13 or the drain 14. In FIG. 2, there is only taken that the anode 02 and the drain 14 are electrically connected as an example for illustration.

It should be noted that the OLED display apparatus comprises an OLED light-emitting device arranged in an array, and a thin film transistor electrically connected to each of the OLED light-emitting device. In the embodiments of the present disclosure, the number of the auxiliary electrodes may be the same as that of the OLED light-emitting devices. Or, alternatively, according to the size of the display apparatus, multiple OLED light-emitting devices may correspond to one auxiliary electrode. That is, multiple OLED light-emitting devices are connected to one auxiliary electrode, which is not limited herein.

The thin film transistor in the display apparatus of embodiments of the present disclosure is described by taking only a bottom-gate type thin film transistor as an example. However, the thin film transistor is not limited to a bottom gate type, and may be a top gate type, which is not limited herein.

Based on same inventive concept, embodiments of the present disclosure further provide a manufacturing method of an organic light-emitting diode display panel. Referring to FIG. 3, the method comprises the following steps.

In step S301, patterns of an anode and an auxiliary electrode are formed on a base substrate, wherein the anode and the auxiliary electrode are insulated from each other.

In step S302, a pattern of a pixel definition layer is formed on the anode and the auxiliary electrode by single-step patterning process. Wherein the pixel definition layer includes a pixel opening region exposing the anode and a via exposing the auxiliary electrode, the pixel opening region makes an obtuse angle between an edge of the pixel definition layer and anode, and the via makes an acute angle between the edge of the pixel definition layer and the auxiliary electrode.

In step S303, a pattern of a luminescent layer and a cathode sequentially is formed on the pixel definition layer, wherein the cathode is electrically connected to the auxiliary electrode arranged in the via.

Patterning process in embodiments of the present disclosure may comprise only a photolithography process, or may comprise a photolithography process and an etching step. At the same time, it may further comprise other processes of printing, inkjet, etc., to form a predetermined pattern. The photolithography process refers to a process of forming a pattern by using a photoresist, a mask, an exposure machine, etc., including a process of film formation, exposure, development, etc. In implementation, corresponding patterning process may be selected in accordance with structures formed in the present disclosure.

It should be noted that, in embodiments of the present disclosure, when the pattern of a pixel defining layer is formed, the pattern may be formed by using an exposure method with one mask and different tilt angles at one time, or the pattern may be formed by using the exposure method with one mask and different tilt angles at two times, which is not limited here.

In the aforesaid manufacturing method of an organic light-emitting diode display panel provided by embodiments of the present disclosure, forming a pattern of a pixel definition layer on the anode and the auxiliary electrode by single-step patterning process, comprises: forming the pixel definition layer on the pattern of the anode and the auxiliary electrode; performing an exposure process on the pixel defining layer by light with a first oblique angle and light with a second oblique angle, respectively, so that the pixel defining layer forms a pattern of the pixel opening region exposing the anode and the via exposing the auxiliary electrode, wherein the pixel opening region makes the obtuse angle between the edge of the pixel definition layer and anode, and the via makes the acute angle between the edge of the pixel definition layer and the auxiliary electrode.

Figure 4B:
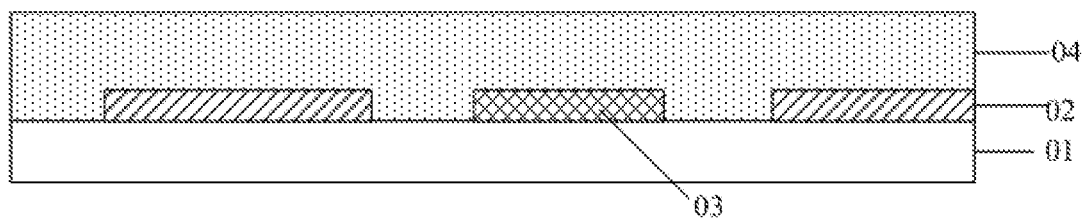
Figure 4C:
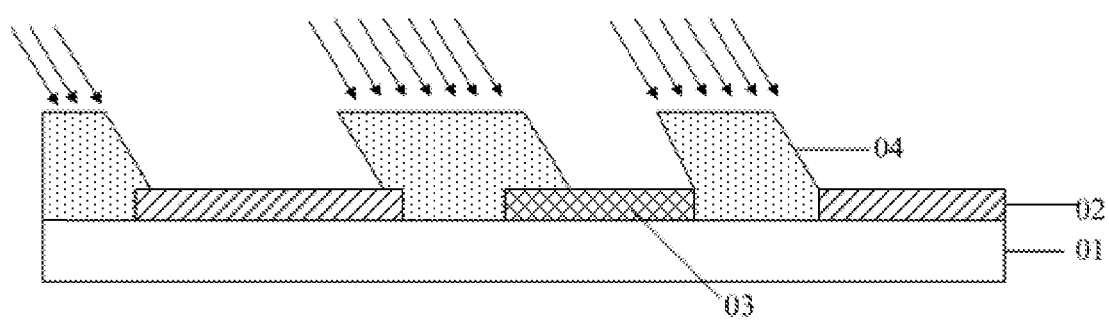
Figure 4D:
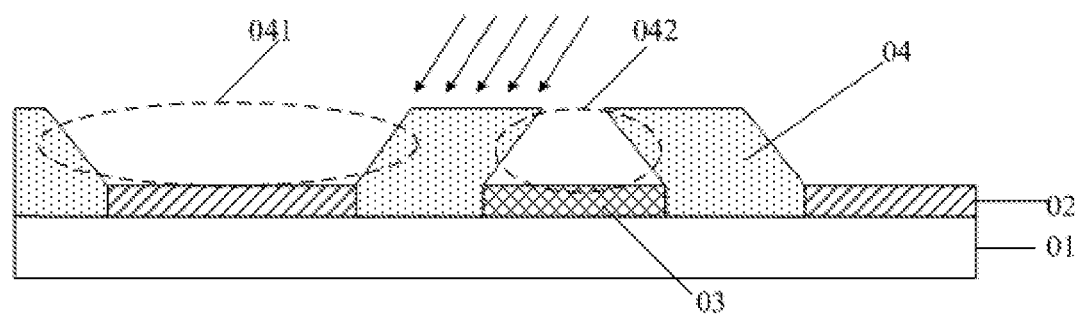

In one example, step one, the pattern of an anode 02 and an auxiliary electrode 03 is formed on a base substrate 01, as shown in FIG. 4A. Step two, a whole layer of the pixel defining layer 04 is formed on the layer where the anode 02 and the auxiliary electrode 03 are located, as shown in FIG. 4B. In the example, the material of the pixel defining layer may be a negative-working material. Step three, when a first exposure process is applied to the pixel defining layer 04, light is set to illuminate from the upper left to the lower right, as indicated by the arrow direction of the light shown in FIG. 4C. In the example, the tilt angle of the light may be arranged according to the actual application to form the pixel defining layer 04 shown in FIG. 4C. Step four, when a second exposure process is applied to the pixel defining layer 04 shown in FIG. 4C, light is set to illuminate from the upper right to the lower left, as indicated by the arrow direction of the light shown in FIG. 4D. In the example, the tilt angle of the light may be arranged according to the actual application to form the pixel defining layer 04 shown in FIG. 4D. That is, the patterns of the pixel opening region 041 and the via 042 are formed.

Wherein, in examples shown in FIG. 4A-FIG. 4D, step three and step four are illuminated by using double-exposure mode, respectively. However, it should be understood that, it may be exposed by one exposure process, and it is also possible to illuminate using light with different tilt angle. And for the pixel defining layer of a negative-working material, light illuminates regions of the pixel defining layer that need to be preserved.

Figure 5A:
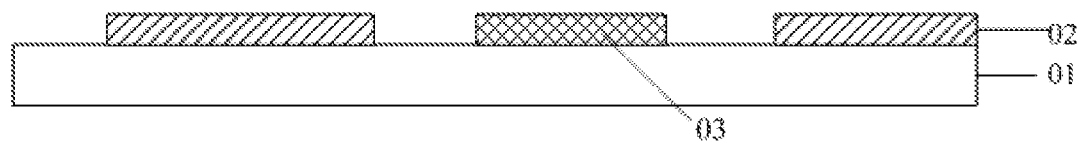
FIG. 5A to FIG. 5D are schematic structural diagrams of another manufacturing method of a pixel definition layer after performing each step provided by embodiments of the present disclosure.
Figure 5B:
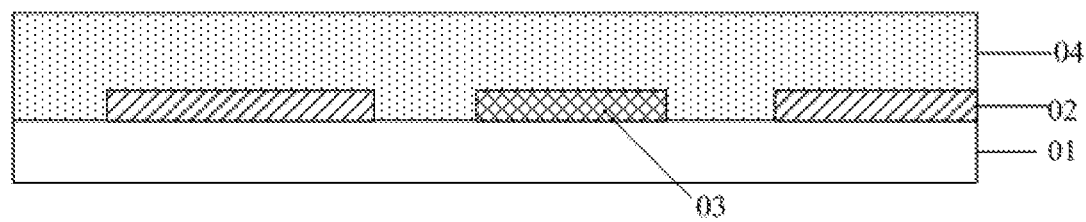
Figure 5C:
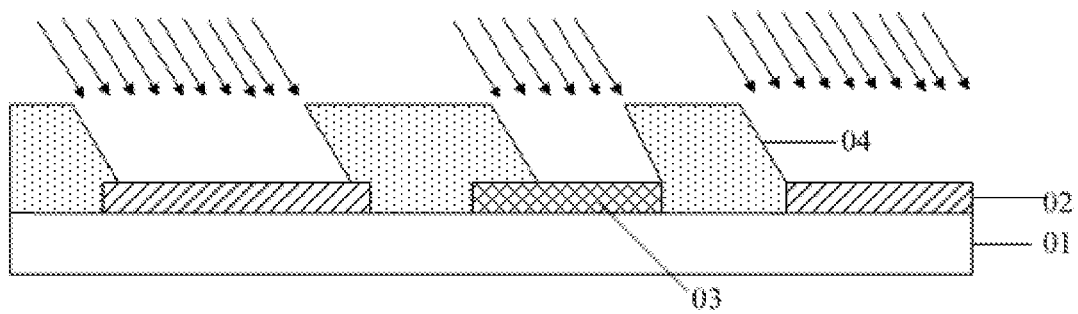
Figure 5D:
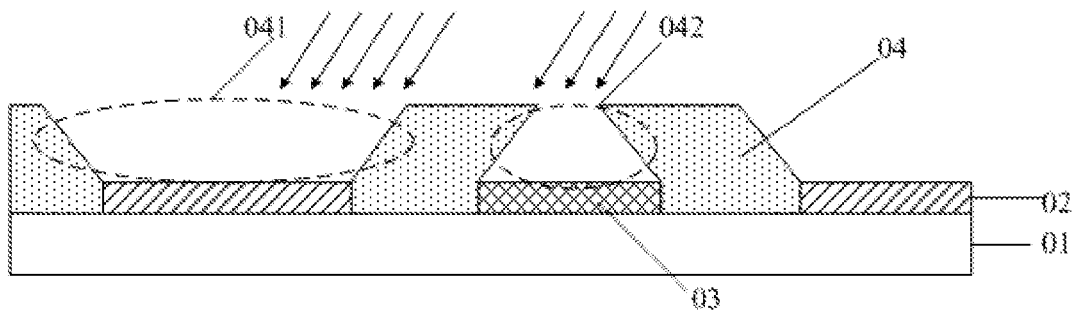

In another example, method of forming the pattern of the pixel defining layer may further comprise: step one, the patterns of an anode 02 and an auxiliary electrode 03 are formed on a base substrate 01, as shown in FIG. 5A. Step two, a whole layer of the pixel defining layer 04 is formed on the layer where the anode 02 and the auxiliary electrode 03 are located, as shown in FIG. 5B. In the example, the material of the pixel defining layer is a positive-working material. Step three, when a first exposure process is applied to the pixel defining layer 04, light is set to illuminate from the upper left to the lower right, as indicated by the arrow direction of the light shown in FIG. 5C. In the example, the tilt angle of the light may be arranged according to the actual application to form the pixel defining layer 04 as shown in FIG. 5C. Step four, when a second exposure process is applied to the pixel defining layer 04 as shown in FIG. 5C, light is set to illuminate from the upper right to the lower left, as indicated by the arrow of the light shown in FIG. 5D. In the example, the tilt angle of the light may be arranged according to the actual application to form the pixel defining layer 04 as shown in FIG. 5D. That is, the patterns of the pixel opening region 041 and the via 042 are formed.

Wherein, step three and step four are illuminated by using double-exposure mode, respectively. It may be exposed by one exposure, and it is also possible to illuminate using light with different tilt angles. And for the pixel defining layer of a positive-working material, light illuminates region of the pixel defining layer that needs to be etched away.

In the aforesaid manufacturing method of an organic light-emitting diode display panel provided by embodiments of the present disclosure, forming the pattern of the luminescent layer and a cathode sequentially on the pixel definition layer comprises: forming a pattern of the luminescent layer on the pixel definition layer; forming a pattern of the cathode metal layer on the pattern of the luminescent, wherein the cathode metal layer in the via is discontinuous with the cathode metal layer on both sides of the via; forming a pattern of a cathode transparent conductive layer on the cathode metal layer, wherein the cathode comprises a cathode metal layer and a cathode transparent conductive layer, and the cathode transparent conductive layer arranged in the via is continuous with the cathode transparent conductive layer arranged on both sides of the via, and the cathode transparent conductive layer is filled to the acute angle of the via such that the cathode transparent conductive layer is in contact with the auxiliary electrode in the via.

Due to the existence of the acute angle in the via, when the luminescent layer is formed on the pixel defining layer, the luminescent layer in the via generates a fault phenomenon, that is, the luminescent layer and the luminescent layer on both sides of the via are discontinuous. The cathode in embodiments of the present disclosure comprises the cathode metal layer and the cathode transparent conductive layer, and in order to increase the transmission effect of the cathode, the cathode metal layer is manufactured thinner, so that when the cathode metal layer is formed at the via, it also generates a same pattern as the luminescent layer, that is, the cathode metal layer in the via generates a fault phenomenon. In order to electrically connect the auxiliary electrode in the via and the cathode, when the cathode transparent conductive layer is formed, the cathode transparent conductive layer is filled into the acute angle when, so that the cathode transparent conductive layer is in direct contact with the auxiliary electrode, thereby electrically connecting the auxiliary electrode and the cathode transparent layer and the cathode metal layer. Therefore, in the manufacturing method of the display panel provided by embodiments of the present disclosure, by adding only one process of manufacturing the auxiliary electrode, a problem of small cathode resistance may be solved without adding other processes.

In the aforesaid manufacturing method of an organic light-emitting diode display panel provided by embodiments of the present disclosure, forming the pattern of the cathode metal layer on the pattern of the luminescent layer, comprises: forming a pattern of the cathode metal layer on the pattern of the luminescent by an evaporation method. When a thin cathode metal layer is formed, the cathode metal layer may be deposited on the luminescent layer by the evaporation method. And during evaporation, molecules or atoms move in a linear manner, so that a linear film layer can only be formed, and the cathode metal layer at the via occurs a fracture phenomenon, and the auxiliary electrode and the cathode metal layer are not connected.

In the aforesaid manufacturing method of an organic light-emitting diode display panel provided by embodiments of the present disclosure, forming a pattern of a cathode transparent conductive layer on the cathode metal layer, comprising: forming a pattern of a cathode transparent conductive layer on the cathode metal layer, by a sputtering method. When forming a thick cathode transparent conductive layer, a cathode transparent conductive layer may be deposited on the cathode metal layer by the sputtering method, so that the molecules and the atoms move in a scattering manner, and the cathode transparent conductive layer may be filled in the acute angle of the via. And the cathode transparent conductive layer is in direct contact with the auxiliary electrode, thereby electrically connecting the auxiliary electrode. And a film layer of the cathode transparent conductive layer is continuous.

The manufacturing method of an organic light-emitting diode display panel provided by embodiments of the present disclosure is described in detail below by an exemplary embodiment.

The manufacturing method of an organic light-emitting diode display panel provided by embodiments of the present disclosure is described below by taking the pixel defining layer of the positive material as an example, the manufacturing method may comprise following steps.

Figure 6A:
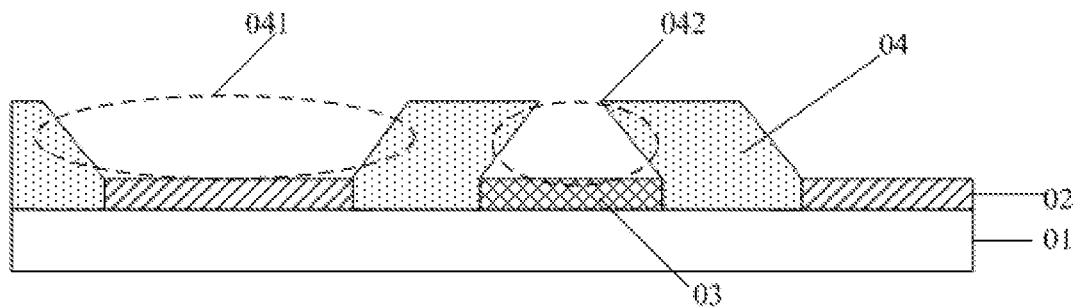
FIG. 6A to FIG. 6D are schematic structural diagrams of a manufacturing method of an organic light emitting diode display panel after performing each step provided by embodiments of the present disclosure.

In step one, the patterns of the anode 02 and the auxiliary electrode 03 are formed on the substrate base 01, the pattern of the pixel defining layer 04 is formed on the anode 02 and the auxiliary electrode 03 by using a mask for double-exposure mode or one-exposure mode. Wherein, the pixel definition layer 04 comprises the pixel opening region 041 exposing the anode 02, and the pixel opening region makes an obtuse angle between an edge of the pixel definition layer and anode. And the pixel definition layer 04 includes a via exposing the auxiliary electrode, and the via makes an acute angle between the edge of the pixel definition layer and the auxiliary electrode, as shown in FIG. 6A.

Figure 6B:
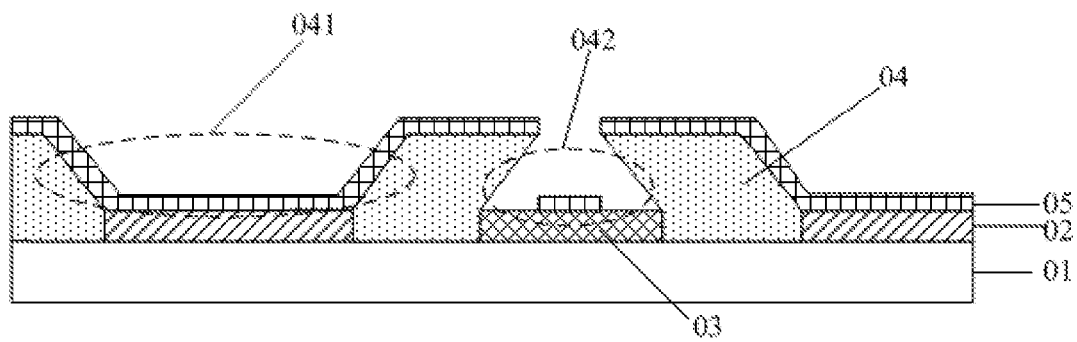

In step two, the pattern of the luminescent layer 05 is formed on the pixel defining layer 04, as shown in FIG. 6B, and the luminescent layer forms a chasm at the via 042.

Figure 6C:
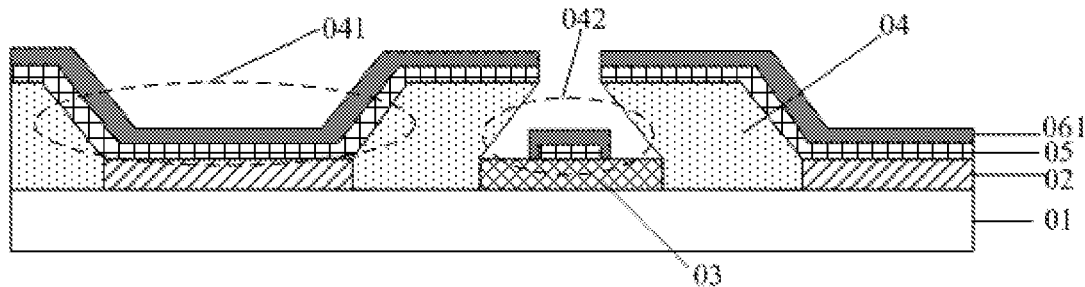

In step three, the cathode metal layer 061 is formed on the luminescent layer 05 by using the evaporation method, as shown in FIG. 6C, and the cathode metal layer 061 forms a chasm at the via 042. And there is no cathode metal layer filling at the acute angle in the via 042.

Figure 6D:
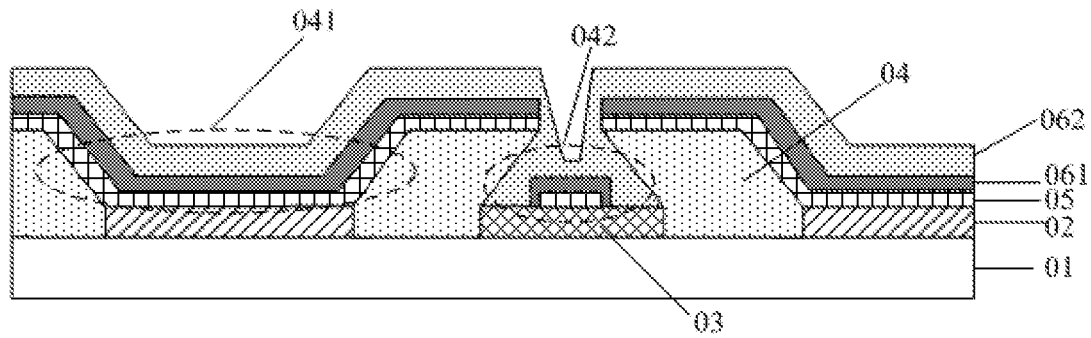

In step four, the pattern of the cathode transparent conductive layer 062 is formed on the cathode metal layer 061 by using the sputtering method. Since the molecules or the atoms move in the scattering manner during sputtering, the cathode transparent conductive layer 062 is filled at the acute angle of the via 042, and is directly in contact with the auxiliary electrode 03, thereby electrically connecting the auxiliary electrode 03, as shown in FIG. 6D.

As described above, the organic light emitting diode provided by embodiments of the present disclosure, by adding the auxiliary electrode in the display panel, and forming the via exposing the auxiliary electrode when the pixel defining layer is formed, the via makes the acute angle between the edge of the pixel defining layer and the auxiliary electrode, so that the chasm occurs when the luminescent layer is formed on the pixel defining layer. That is, the luminescent layer in the via and the luminescent layer on both sides of the via are broken. The existence of the acute angle in the via prevents the luminescent layer from filling into the acute angle. Therefore, when the cathode on the luminescent layer is formed, the auxiliary electrode and the cathode are electrically connected by the via. Therefore, in embodiments of the present disclosure, by adding the auxiliary electrode, the auxiliary electrode and the cathode are electrically connected, thereby reducing the resistance of the cathode. The problem of poor brightness uniformity of the OLED display panel is avoided.

Obviously, those skilled in the art may make various changes and modifications to the present disclosure without departing from the spirit and scope of the disclosure. Thus, if these modifications and variations of the present disclosure fall within the scope of the claims of the present disclosure and their equivalent technologies, the present disclosure is further intended to include these modifications and variations.

What is claimed is:

1. A manufacturing method of an organic light-emitting diode display panel, comprising:
    forming patterns of an anode and an auxiliary electrode on a base substrate, wherein the anode and the auxiliary electrode are insulated from each other;
    forming a pattern of a pixel definition layer on the anode and the auxiliary electrode, wherein the pixel definition layer includes a pixel opening region exposing the anode and a via exposing a surface of the auxiliary electrode; and
    forming a pattern of a luminescent layer and a pattern of a cathode sequentially on the pixel definition layer, wherein the cathode is electrically connected to the auxiliary electrode arranged in the via,
    wherein the via comprises a first oblique surface and a second oblique surface facing each other, the first oblique surface forms a first acute angle with respect to the surface of the auxiliary electrode exposed by the via, and the second oblique surface forms a second acute angle with respect to the surface of the auxiliary electrode exposed by the via,
    wherein forming a pattern of a pixel definition layer on the anode and the auxiliary electrode is performed by a single-step patterning process, and comprises:
    forming the pixel definition layer on the patterns of the anode and the auxiliary electrode;
    performing an exposure process on the pixel definition layer by light with a first oblique angle and light with a second oblique angle, respectively, so that the pixel definition layer forms a pattern of the pixel opening region exposing the anode and the via exposing the surface of the auxiliary electrode, wherein the pixel opening region makes an obtuse angle between an edge of the pixel definition layer and anode, the first oblique surface of the via forms the first acute angle with respect to the surface of the auxiliary electrode exposed by the via, and the second oblique surface of the via forms the second acute angle with respect to the surface of the auxiliary electrode exposed by the via.

2. The method according to claim 1, wherein, forming the pattern of the luminescent layer and a cathode sequentially on the pixel definition layer, comprises:
    forming a pattern of the luminescent layer on the pixel definition layer;
    forming a pattern of a cathode metal layer on the pattern of the luminescent layer, wherein the cathode metal layer in the via is discontinuous with the cathode metal layer on both sides of the via;
    forming a pattern of a cathode transparent conductive layer on the cathode metal layer, wherein the cathode comprises the cathode metal layer and the cathode transparent conductive layer, and the cathode transparent conductive layer arranged in the via is continuous with the cathode transparent conductive layer arranged on both sides of the via, and the cathode transparent conductive layer is filled to the first acute angle and the second acute angle of the via such that the cathode transparent conductive layer is in contact with the auxiliary electrode in the via.

3. The method according to claim 2, wherein, forming the pattern of the cathode metal layer on the pattern of the luminescent layer, comprises:
    forming the pattern of the cathode metal layer on the pattern of the luminescent layer by an evaporation method.

4. The method according to claim 2, wherein, forming the pattern of the cathode transparent conductive layer on the cathode metal layer, comprises:
    forming the pattern of the cathode transparent conductive layer on the cathode metal layer by a sputtering method.

5. The method according to the claim 2, wherein, a thickness of the cathode transparent conductive layer is greater than a thickness of the cathode metal layer.

6. The method according to the claim 2, wherein, the cathode metal layer is formed with a thickness of 1 to 30 nm.

7. The method according to the claim 2, wherein, the cathode transparent conductive layer is formed with a thickness of 10 to 1000 nm.

8. The method according to claim 1, wherein, the auxiliary electrode and the anode have a same material and are arranged in a same layer.

* * * * *